United States Patent [19]

Natori

[11] Patent Number: 5,224,069
[45] Date of Patent: Jun. 29, 1993

[54] FERROELECTRIC CAPACITOR MEMORY CIRCUIT MOS SETTING AND TRANSMISSION TRANSISTORS

[75] Inventor: Kenji Natori, Kanagawa, Japan

[73] Assignee: Kabushiki Kaisha Toshiba, Kawasaki, Japan

[21] Appl. No.: 832,806

[22] Filed: Feb. 7, 1992

Related U.S. Application Data

[63] Continuation of Ser. No. 548,823, Jul. 6, 1990, Pat. No. 5,121,353.

[30] Foreign Application Priority Data

Jul. 6, 1989 [JP] Japan .................. 1-172868
Aug. 4, 1989 [JP] Japan .................. 1-201365

[51] Int. Cl.5 ................ G11C 7/00; G11C 11/22
[52] U.S. Cl. ................ 365/145; 365/189.01
[58] Field of Search ................ 365/145, 149, 189.01, 365/189.04

[56] References Cited

U.S. PATENT DOCUMENTS

3,401,377 9/1968 Bartlett et al. ................ 365/145
4,873,664 10/1989 Eaton, Jr. ................ 365/145
5,038,323 8/1991 Schwee ................ 365/145

Primary Examiner—Alyssa H. Bowler
Attorney, Agent, or Firm—Foley & Lardner

[57] ABSTRACT

A is a memory circuit including a plurality of ferroelectric capacitors arranged in a matrix, setting MOS field effect transistors for setting both electrodes of each of the ferroelectric capacitor at the same electric potential, and transmission MOS field effect transistors for transmitting information to the ferroelectric capacitors, and having a construction in which two word lines are provided corresponding to each line of the ferroelectric capacitors, one bit line is provided corresponding to each row of the ferroelectric capacitors, each of the transmission MOS field effect transistors is connected to one of the word lines and the bit line, and each of the setting MOS field effect transistors is connected to the other word line. Also disclosed is a memory circuit including memory cells each composed of each of ferroelectric capacitors arranged in a matrix and transmission MOS field effect transistors provided corresponding to the ferroelectric capacitors for transmitting information to the ferroelectric capacitors, line address decoders each provided corresponding to each group of the memory cells in each line for controlling the input and output of information to the ferroelectric capacitors, word lines provided corresponding to each group of memory cells in each line for selecting the line, and drive lines for commonly controlling the ferroelectric capacitors in the group of memory cells, and having a construction in which the word lines and the drive lines are connected to the line address decoders, and bit lines are provided corresponding to each row of the memory cells.

3 Claims, 6 Drawing Sheets (TIMING CHART OF WRITING OPERATION)

(TIMING CHART OF READING OPERATION)

(TIMING CHART OF WRITING OPERATION)

(TIMING CHART OF READING OPERATION)

(TIMING CHART OF WRITING OPERATION)

(TIMING CHART OF READING OPERATION)

FERROELECTRIC CAPACITOR MEMORY CIRCUIT MOS SETTING AND TRANSMISSION TRANSISTORS

This application is a continuation of application Ser. No. 07/548,823, filed Jul. 6, 1990 now U.S. Pat. No. 5,121,353.

BACKGROUND OF THE INVENTION

1. Field of the Invention

The present invention relates to a memory circuit provided with a plurality of memory cells for storing information, and particularly to a memory circuit which is composed of memory cells of ferroelectric capacitors requiring no refresh operation.

2. Description of the Prior Art

FIG. 1 is a diagram to show a construction of a memory cell of a conventional memory integrated circuit using a ferroelectric capacitors.

In the above circuit construction, the writing operation of data is carried out, as shown in FIG. 2A, by setting an electric potential of a bit line 1B at a high electric potential (H level) or a low electric potential (L level) in accordance with the data to be stored, setting a field effect transistor 1 in the conducting state by elevating an electric potential of a word line 1W, setting a node 2 at an electric potential of the data, and applying a pulse signal $\phi$ to a clock line 1C. Thereby, a capacitor memory cell is constructed, and a direction of spontaneous polarization of a ferroelectric capacitors 3 composed of lead zircon-titanate (PZT) is determined in accordance with an electric potential of the data.

In the same drawing, for example, when a writing operation of H level data is carried out, and if the node 2 is in the H level state and the clock line 1C is in the L level state, an electric field in the ferroelectric capacitors 3 is applied in the direction of arrow 4, and the spontaneous polarization of the ferroelectric capacitors 3 is generated in parallel with this direction.

While, when a writing operation of L level data writing is carried out, and if the pulse signal $\phi$ of the H level is outputted onto the clock line 1C, the spontaneous polarization of the ferroelectric capacitor 3 is generated in the direction of arrow 5. Namely, the polarization direction of arrow 5 shows the data to be stored in the ferroelectric capacitor 3, and since this polarization is not changed even when a power source (not shown) is switched off, nonvolatile data storage can be realized.

To read the data stored in the ferroelectric capacitor 3 as the memory cell in the circuit, as shown in FIG. 2B, the clock line 1C is set at the L level to place the bit line 1B in the floating state of the H level, and the electric potential of the word line 1W is elevated, so that the transistor 1 in the memory cell so as to be accessed is in the conducting state. Thereby, the node 2 is set at the H level, and an electric field is applied in the direction of arrow 4 in the ferroelectric capacitor 3. Accordingly, when the polarization direction becomes the same as the direction of arrow 4, since the state is held, the electric potential of the bit line 1B is not changed.

However, when the polarization direction is the same as the direction of arrow 5, the polarization direction is inverted to be the direction of arrow 4. At this time, the electric potentials of the node 2 and the bit line 1B are reduced by an amount corresponding to the polarization inversion. In FIG. 2B, the amount of polarization inversion is shown by reference numeral 6. The reduction of the electric potential of the bit line 1B is amplified and outputted by a sense amplifier 7 connected to the bit line 1B.

Thereafter, to restore the amount of polarization inversion to the value originally generated at the reading operation, a pulse signal $\phi$ of H level is outputted onto the clock line 1C to restore the polarization state of the ferroelectric capacitor 3 to the original state (the direction designated by arrow 4), and then the next operation, for example, a rewriting operation is performed.

Moreover, it is preferred that the ferroelectric capacitor memory requires no periodical refresh operation as a dynamic memory. Namely, when the refresh operation is included in the circuit operation, the throughput is reduced and the electric power to be used must be increased. Moreover, it is desired that the data in the ferroelectric capacitor 3 is not lost during the supplying of a power source.

However, in case the memory cell is as mentioned above, data are occasionally lost when the refresh operation is not carried out.

Namely, in FIG. 1, when the clock line 1C is in the L level state after information as data to be stored is written in the ferroelectric capacitor 3 under the setting of the node 2 at the H level (in the polarization direction of arrow 4 in FIG. 1), since the substrate of the transistor 1 is normally connected to Vss, the level of the node 2 is reduced to the L level because of leakage current through the PN junction between the substrate and the source/drain.

Accordingly, when a clock pulse $\phi$ of H level is outputted onto the clock line 1C to write data in another memory cell, an electric field applied to the ferroelectric capacitor 3 becomes inverse to that of the data writing at the H level, so that the polarization is inverted (in the polarization direction designated by the arrow 5 in FIG. 1) to lose data. The reason is that the node 2 is shut off from the bit line 1B and will be at the L level when a pulse signal $\phi$ of H level is provided on the clock line 1C.

SUMMARY OF THE INVENTION

Therefore, the invention has been made in the light of this problem, and it is an object thereof to provide a nonvolatile memory circuit requiring no refresh operation and which operates statically.

To achieve this object, a memory circuit according to a preferred embodiment of the present invention comprises a plurality of storage means respectively composed of ferroelectric capacitors each formed by interposing a ferroelectric between two electrodes thereof and arranged in a matrix state for storing information as states of polarization of the ferroelectric capacitor, and setting means provided corresponding to respective storage means for setting both the electrodes of the storage means at the same electric potential. The storage means respectively have transmission means for transmitting the information to the storage means, and two word lines are provided to each line of the plurality of storage means respectively, further one bit line is provided to each row consisting of the plurality of storage means. Moreover, each of the transmission means is connected to one of the word lines and the bit line, and each of the setting means is connected to the other word line.

Namely, when a pulse for writing is inputted to the memory cell, each of the setting means can set both ends of each of the storage means (ferroelectric capacitor) in the memory cell, which is not accessed, at the same electric potential, the inverse electric field is not applied to the storage means, so that the data are not lost. Accordingly, it becomes possible to always prevent destruction of the storage information, thus a random access memory circuit which requires no refresh operation and is nonvolatile can be provided.

Moreover, a memory circuit according to an another preferred embodiment of the present invention comprises a plurality of storage means respectively composed of ferroelectric capacitors each formed by interposing a ferroelectric between two electrodes thereof and arranged in a matrix state for storing information as states of polarization of the ferroelectric, transmission means provided in the respective storage means for transmitting the information to the storage means, control means provided in each line consisting of a group of memory cells for controlling input and output of the information to the storage means, each of which is composed of each of the storage means and each of the transmission means, and word lines provided correspondingly to the group of memory cells in each the line for selecting the line and drive lines for commonly controlling the storage means in the group of memory cells, and bit lines provided correspondingly to each row of the memory cells.

As stated above, since the storage means in the respective memory cells, which are connected to the same word line can be commonly controlled when the group of the memory cells are selected by the control means, the destruction of storage information can be prevented. Thereby, a memory circuit requiring no refresh operation and operating statically can be provided.

These and other objects, feature and advantages of the present invention will be more apparent from the following description of a preferred embodiment, taken in conjunction with the accompanying drawing.

DETAILED DESCRIPTION OF THE EMBODIMENT

Figure 3:
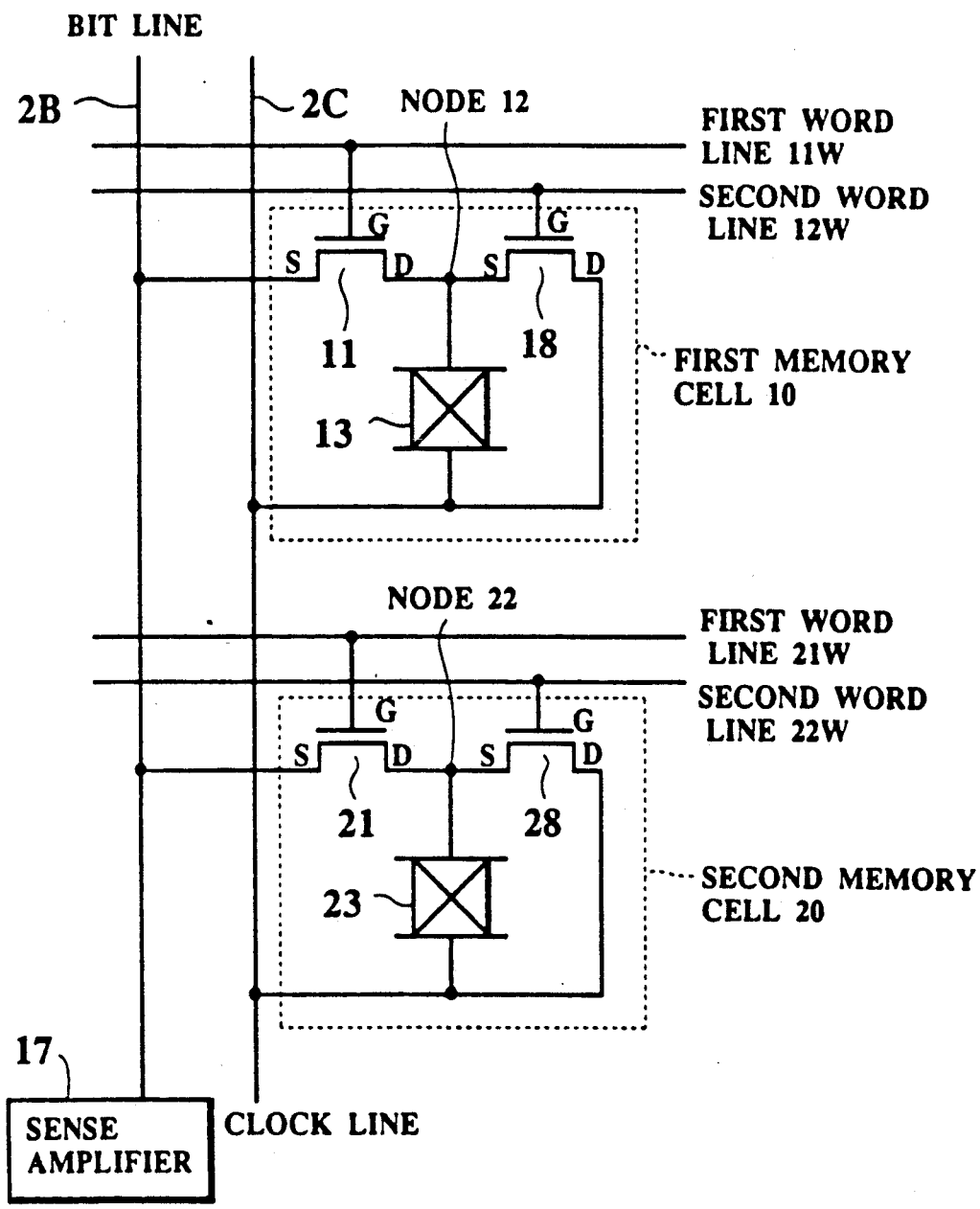
FIG. 3 is a constructional diagram of a memory cell in a memory circuit as a first embodiment of the present invention.

FIG. 3 shows a constructional diagram of a memory circuit as a first embodiment of the present invention. In this drawing, to simply explain construction of the circuit memory, construction of only a first and a second memory cell 10 and 20 are shown.

Figure 1:
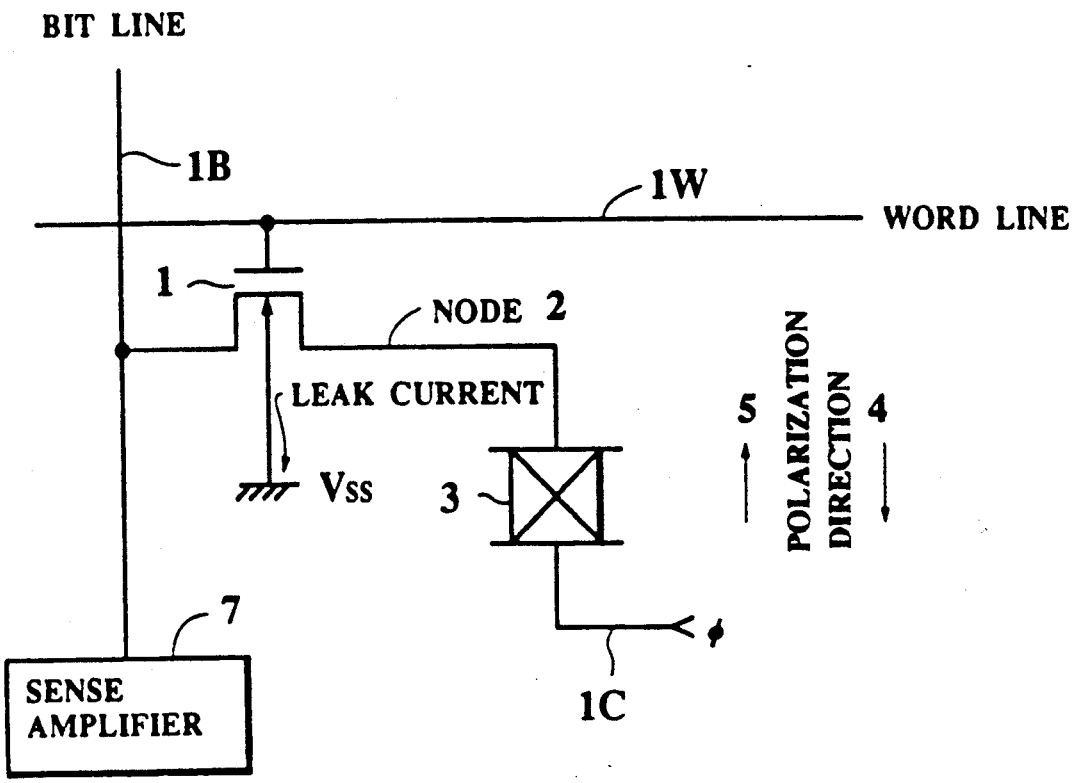
FIG. 1 is a constructional diagram of a memory cell in a memory circuit which is ordinarily used.

In these memory cells 10, 20, as compared with the construction of the ordinary memory circuit as shown in FIG. 1, additional MOS transistors 18, 28 as setting means for setting both electrodes of respective ferroelectric capacitors 13, 23 as storage means at the same electric potential (by a short circuit) are respectively provided.

The gate electrodes G of the additional MOS transistors 18, 28 are respectively connected to second word lines 12W, 22W, and the source electrodes and the drain electrodes are connected to both terminals (both electrodes) of ferroelectric capacitors 13, 23. Incidentally, for example, the ferroelectric capacitors 13, 23 are prepared with lead zircon-titanate.

Since polarities of signals outputted to first word lines 11W, 21W and the second word lines 12W, 22W are inverse to each other, when the MOS transistor 11 or 21 is ON (conducting), the MOS transistor 18 or 28 becomes OFF (nonconducting).

In the same manner, the remaining memory cells not shown in the drawing other than the first and the second memory cells have the same construction. Incidentally, reference numeral 17 in FIG. 3 shows a sense amplifier as similarly shown in the memory circuit of FIG. 1.

Figure 4A:
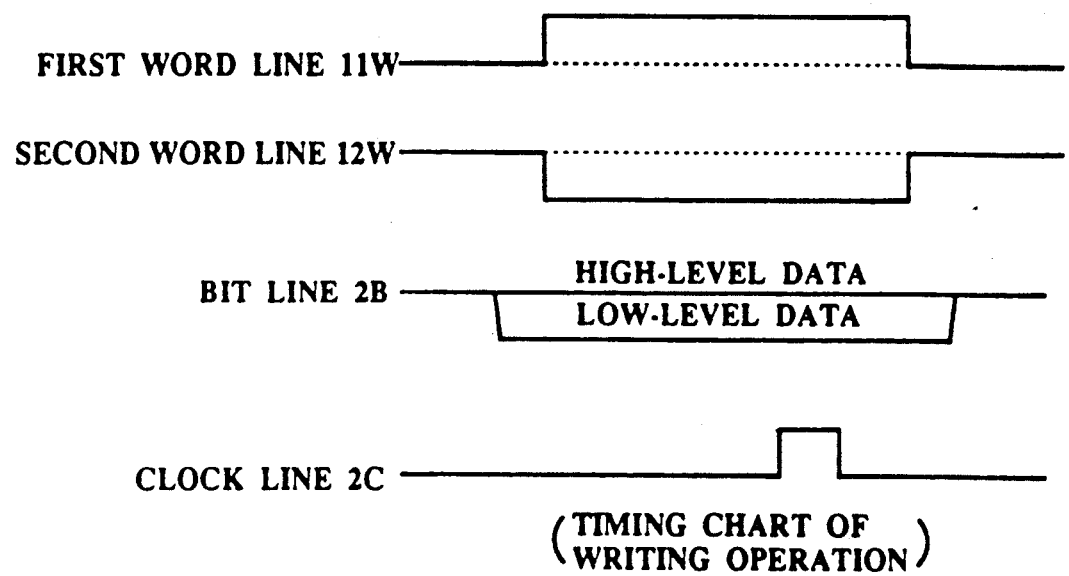
FIGS. 4A and 4B are timing charts to respectively explain operation of the memory cell in FIG. 3.
Figure 4B:
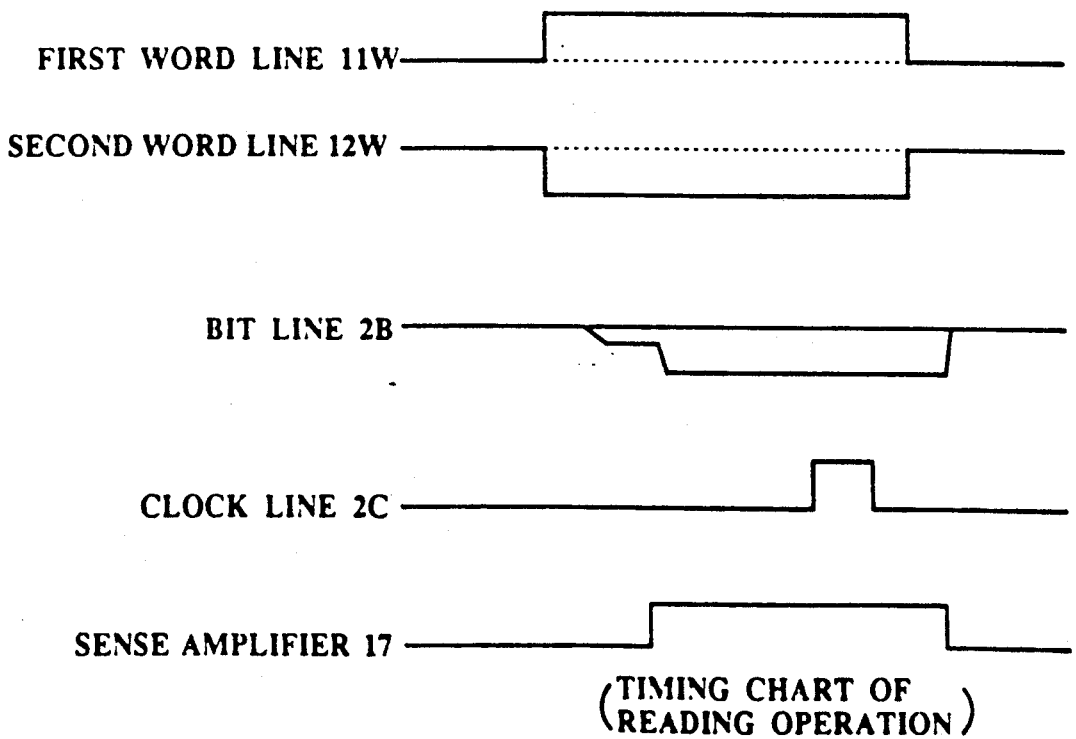

Next, operation of the memory circuit of the present invention is explained with reference to FIGS. 4A and 4B.

During a writing operation for data, the first word line 11W in the first memory cell 10 to be accessed is set at the H level to make the transistor 11 conducting. At this time, since a signal of inverse phase to the first word line 11W is applied to the second word line 12W, the transistor 18 is cut off. Then, when the node 12 has the same electric potential as that of the bit line 2B, it outputs a pulse signal $\phi$ of H level to the clock line 2C to adjust the polarization direction of the ferroelectric capacitor 13 to be equal to the input data. Thereafter, the electric potential of the first word line 11W is lowered to cut off the transistor 10, then the electric potential of the second word line 12W is elevated to make the transistor 18 conducting.

Thereby, both the electrodes of the ferroelectric capacitor 13 are grounded, i.e., they are at the same electric potential, and the spontaneous polarization once set is not lost.

On reading data, a pulse signal $\phi$ of L level is outputted on the clock line 2C, then the bit line 2B is set at the H level to cause a memory cell to be accessed, for example, by the transistor 11 conducting by elevating the electric potential of the first word line 11W. As a result, the transistor 18 becomes nonconducting. Thereby, the node 12 becomes the H level, the polarization data in the memory cell is read as an output on the bit line 2B. The data obtained in this manner are outputted to an external circuit after being amplified by the sense amplifier 17.

While data stored in each ferroelectric capacitor 13 of the memory cells are lost on polarization inversion, rewriting can be carried out by outputting a pulse signal $\phi$ of H level on the clock line 2C when the electric potential of the bit line 2B is correctly set. Thereafter, the transistor 11 is set in the OFF state, and the transistor 18 is set in the ON state, so as to set both the electrodes of the ferroelectric capacitor 13 at ground potential.

As stated above, when the first memory cell 10 is not accessed, the electric potential of the first word line 11W does not become H level, and the transistor 18 is kept in the conducting state. Thus, even when a pulse signal $\phi$ of H level is outputted on the clock line 2C, both the electrodes of the ferroelectric capacitor 13 are short-circuited to be at the same electric potential, thus they will not be at inverse potentials to each other. Accordingly, loss of data is not caused.

As a result, it is possible to obtain a random access memory which requires no refresh operation and is nonvolatile. Incidentally, operation of the second memory cell 20 is entirely the same as that of the fist memory cell, thus an explanation thereof is omitted here.

In the present invention, the second word line 12W to provide a signal of inverse polarity to the first word line 11W is provided so as to set and keep both the electrodes of the ferroelectric capacitor at the same electric potential by controlling conduction of the MOS transistor 18 connected to the second word line 12W.

Accordingly, data stored in the capacitor are protected from various noises, and a highly reliable ferroelectric memory can be realized.

Figure 5:
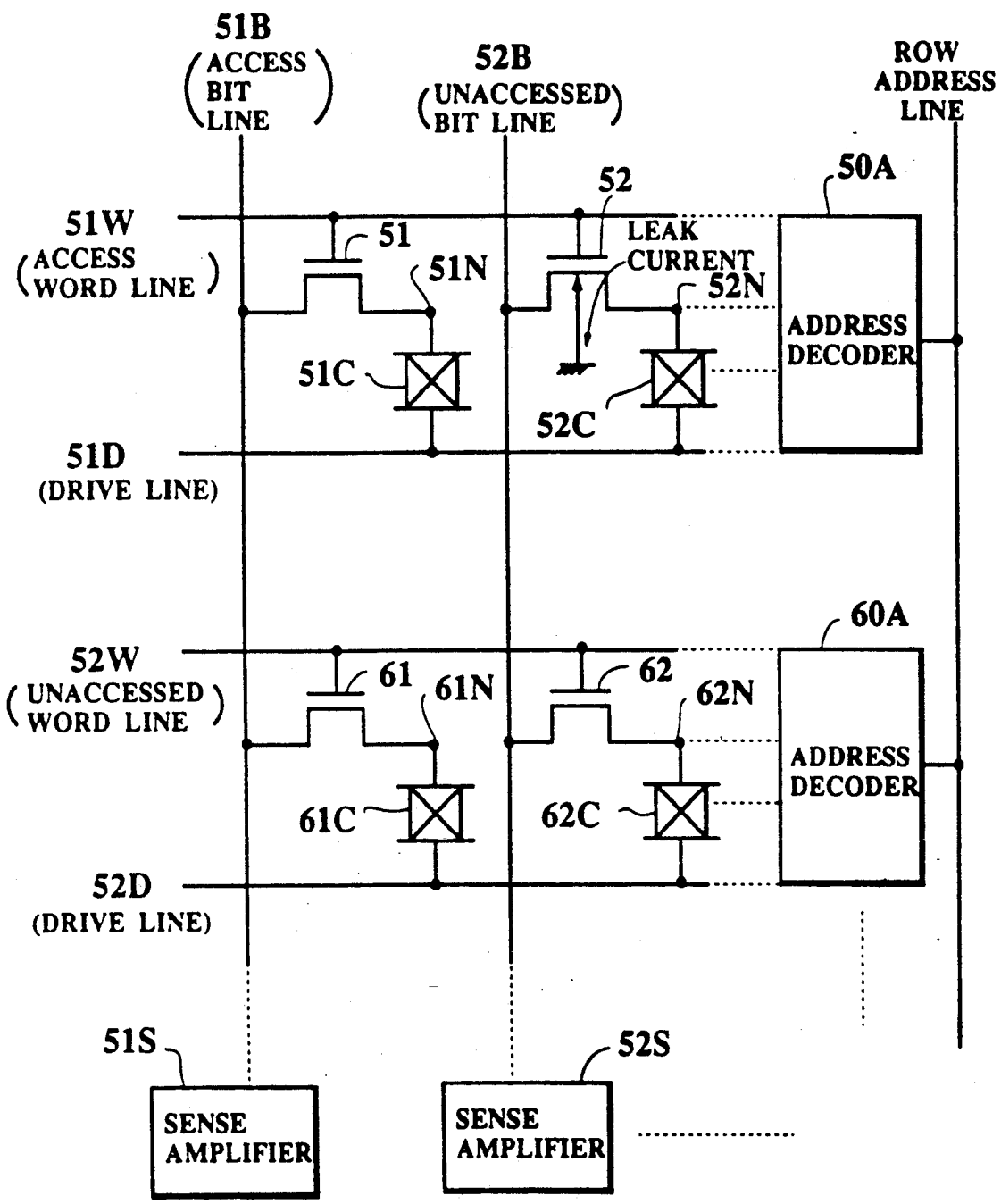
FIG. 5 is a constructional diagram of a memory cell as a second embodiment of the present invention.

FIG. 5 is a constructional diagram mainly showing a memory cell of a memory circuit related to a second embodiment of the present invention.

As shown in this diagram, the memory circuit is composed by a matrix arrangement of transistors 51, 52, ... , 61, 62, ..., as transfer means, whose gates are respectively connected word lines, and memory cells respectively comprising ferroelectric capacitors 51C, 52C, ... , 61C, 62C, ..., as storage means, respective ends of which are connected to bit lines 51B, 52B through the transistors 51, 52, ..., 61, 62, ..., and the respective other ends of which are connected to drive lines 51D, 52D. Incidentally, the ferroelectric capacitors 51C, 52C, ..., 61C, 62C, ..., are made with, for example, lead zircontitanate.

Moreover, an address decoder is provided at each word line as control means for controlling operation of the transfer means and storage means connected to the word lines.

Figure 2A:
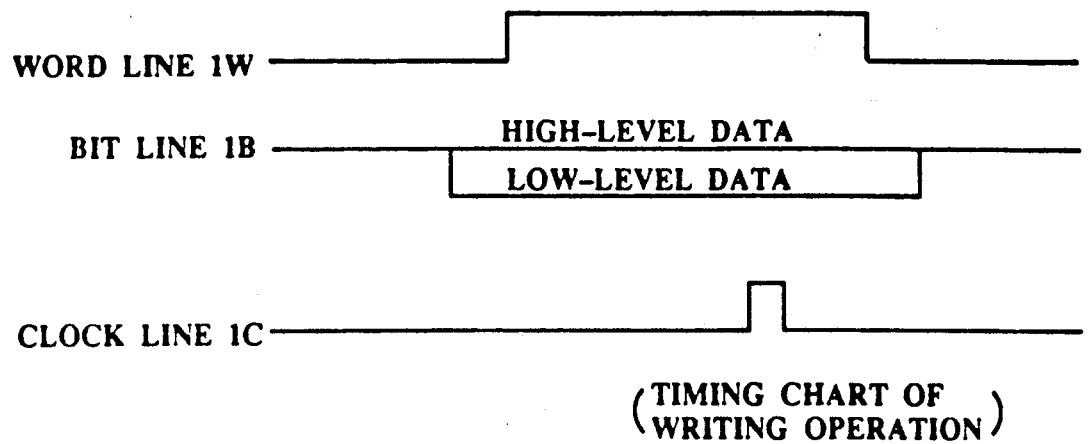
FIGS. 2A and 2B are timing charts to respectively explain operation of the memory cell in FIG. 1.
Figure 2B:
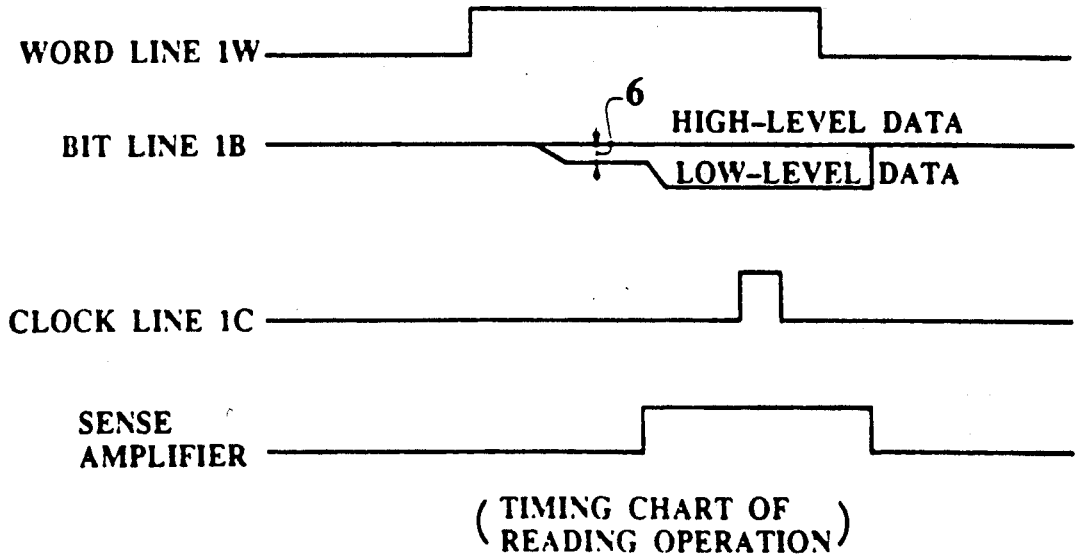

Reading and writing operations of the memory cells to select the word lines are respectively carried out in the same manner as those in the memory circuit shown in FIG. 2.

The memory cells connected to the same word line are selected and operated by the address decoders 50A, 60A, ..., for controlling these word lines. Moreover, in the ferroelectric capacitors of the memory cells connected to the word line, the other end terminals are respectively connected to the drive lines connected to the same address decoder. Namely, these ferroelectric capacitors in the respective memory cells are also controlled and operated by these address decoders.

Next, the reading and writing operations in the entire body of the memory circuit are explained with reference to FIGS. 6A and 6B.

In this case, a memory cell to be accessed is a memory cell at an intersection of the bit line 51B and the word line 51W.

Figure 6A:
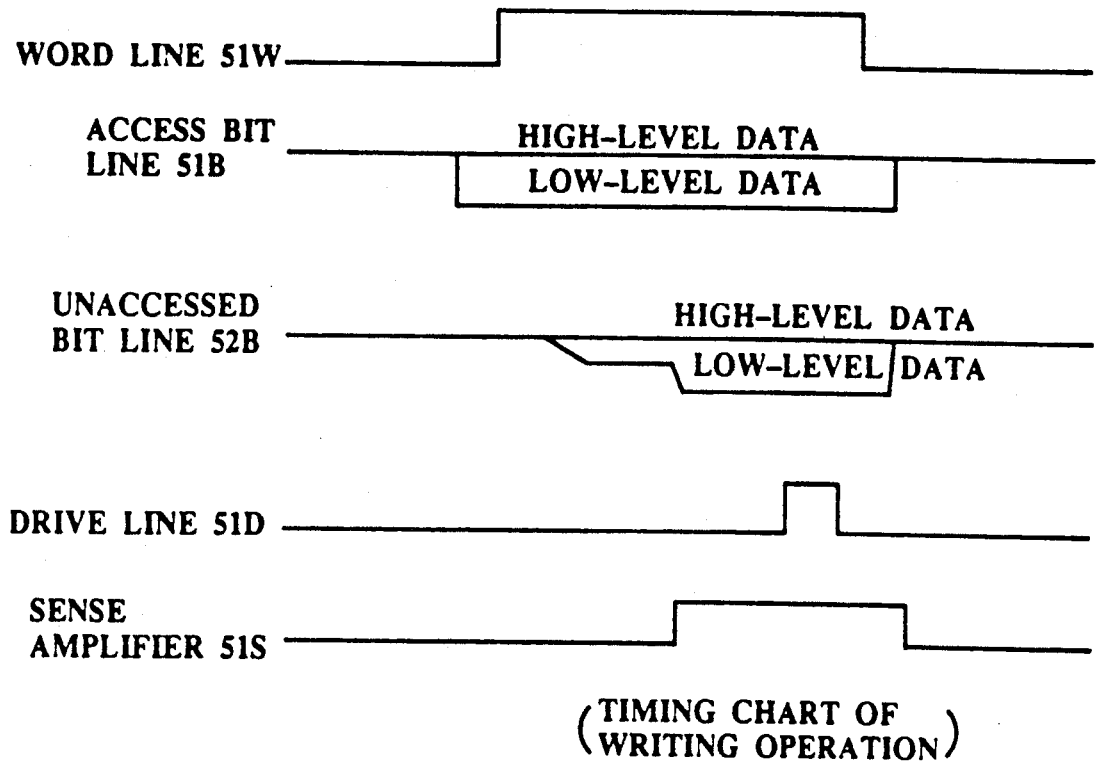
FIGS. 6A and 6B are timing charts to respectively explain operation of the memory circuit in FIG. 5.
Figure 6B:
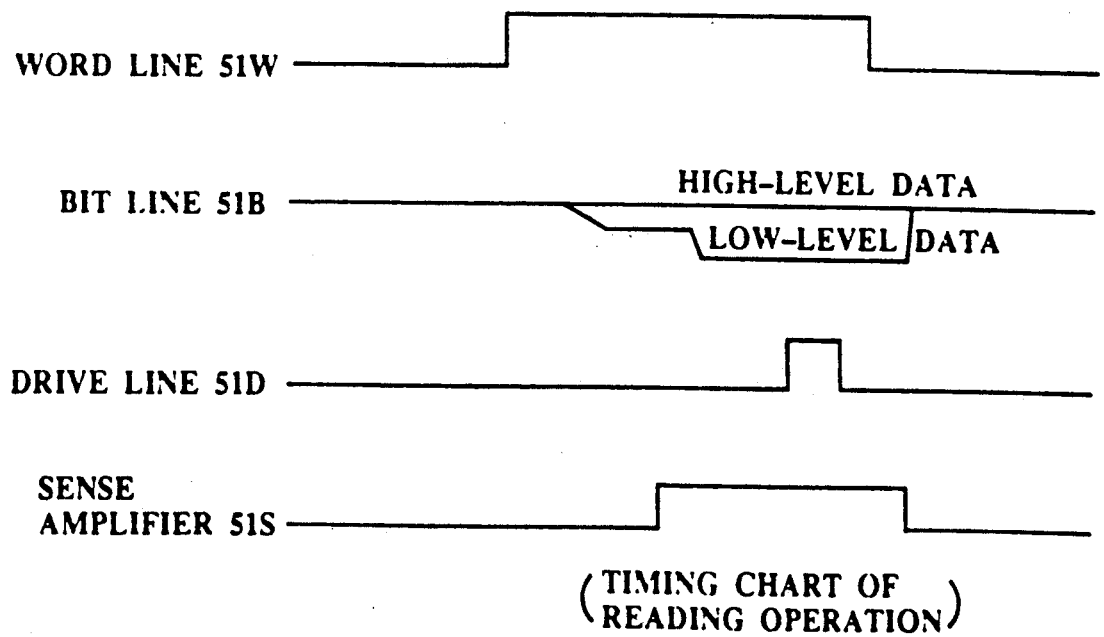

First, in the reading operation, as shown in FIG. 6B, the word line 51W is selected by the address decoder 50A, and the transistors 51, 52 are in the conducting state. Then, a sense amplifier 51S connected to the bit line 51B and a sense amplifier 52S connected to the bit line 52B start a reading operation respectively. However, a gate circuit (not shown) for transferring the output of the sense amplifier 52S to an output line (not shown) is in the nonconducting state, thus the sense amplifier 52S is not selected. Thereby, data amplified by sense amplifier 52S through the bit line 52B are not read to the external circuit.

While the sense amplifier 51S is in the selection state, data amplified by the sense amplifier 51S through the bit line 51B are read to the external circuit from the sense amplifier 51S.

Accordingly, only data stored in the storage dielectric 51C in the memory cell at the intersection of the word line 51W and the bit line 51B are read to the external portion.

In this case, data of H level are written at a node 52N of the ferroelectric capacitor 52C connected to the drive line 51D, and the spontaneous polarization of the ferroelectric capacitor 52C is in the state designated by the arrow 4 shown in FIG. 1. Then, the potential of the node 52N is lowered from H level to L level in the polarization state.

In such a state, when the word line 51W is selected and is in the reading state, a current flows in the node 52N through the transistor 52 which becomes conducting by the bit line 52B at H level. Thus, the node 52N also becomes H level. In this case, since the capacity of the node 52N is extremely small, even when a current flows in the node 52N from the bit line 52B, the electric potential of the bit line 52B is never lowered under a comparison standard voltage value compared with the electric potential of the bit line 51B and the sense amplifier 52S on the reading operation.

Therefore the electric potential of the bit line 52B is slightly lowered as compared with the original potential of the bit line 52B by charging the node 52N. However, the potential is restored up to the original H level of the bit line 52B by the reading operation carried out by the sense amplifier 52S. Accordingly, in the node 52N, data of H level which is the original state before the potential is lowered by the leakage current are rewritten.

Therefore, in the reading operation, when the electric potential of the node 52N is lowered from H level to L level by the leakage current, even if a clock pulse as shown in FIG. 6B is applied to the drive line 51D, the spontaneous polarization of the ferroelectric capacitor 52C is returned to the state before the reading operation, thus the data contained therein are not destroyed.

While, the memory cells connected to the nonselected word line 52W are not provided a clock pulse through the drive line 52D, the spontaneous polarization states of the ferroelectric capacitors 61C, 62C are not changed. Next, in the writing operation, as shown in FIG. 6A, writing information is provided to the bit line 51B from the sense amplifier 51S. Then, writing information is provided to the ferroelectric capacitor 51C through the transistor 51 connected to the word line 51W on which is selected the writing information.

At this time, as shown in FIG. 6A, a clock pulse is provided to the drive line 51D from the address decoder 50A. Therefore, the clock pulse is also applied to the ferroelectric capacitor 52C in the memory cell connected to the word line 51W.

However, since the writing information is not provided on the bit line 52B connected to the memory cell of the ferroelectric capacitor 52C, the bit line 52B is in the floating state at H level, which is the same as that in the reading state. Therefore, even when the clock pulse is provided thereto from the address decoder 50A through the drive line 51D, the reading operation is carried out in the memory cell connected to the word line 51W and the bit line 52B. However, the writing operation is not carried out in this case.

Accordingly, in case information of L level has been already written in the ferroelectric capacitor 52C, the spontaneous polarization of the ferroelectric capacitor 52C is inverted by the reading operation. However, when the clock pulse is provided to the drive line 51D, since data of the same level as those stored until then are rewritten, the spontaneous polarization is returned to the original state. Therefore even if the clock pulse is provided on the drive line 51D, the destruction of data stored can be prevented.

In the memory cells connected to the nonselected word line 52W, the transistors 61, 62 remain in the nonconducting state. However, to the ferroelectric capacitors 61C, 62C in these memory cells, the clock pulse is not provided from the address decoder 60A through the drive line 52D. Therefore, even when the potentials of the nodes 61N, 62N are lowered from H level to L level by the leakage current, the spontaneous polarization states of these ferroelectric capacitors are not changed, so that the inversion and destruction of stored information can be prevented.

Moreover, in the above mentioned preferred embodiment, the address decoder as the control means is provided at each of the word lines and the drive lines. But another embodiment, in which a first control means and a second control means are provided at each of the word lines and the drive lines respectively, is also possible. The effect of the invention remains the same. Various modification will become possible for those skilled in the art after receiving the teachings of the present disclosure without departing from the scope thereof.

What is claimed is:

1. A memory circuit with ferroelectric capacitors, comprising:

a plurality of storage means arranged in rows and columns forming a matrix, each storage means having one ferroelectric capacitor of a two electrode type, for storing data to be stored as a polarization state of said ferroelectric capacitor;

transmission means, provided for each said storage means, for transmitting said data to said storage means and for reading said data into said storage means, said transmission means having a drain connected to one electrode of said ferroelectric capacitor;

a word line, provided in each row of said rows of said plurality of said storage means, for controlling said transmission means in each said row, said word line being connected to a gate of each said transmission means in said storage means of each said row;

a drive line, provided in each said row of said plurality of said storage means, for controlling said ferroelectric capacitors in each said row, said drive line being connected to another electrode of said ferroelectric capacitor in each said storage means of each said row;

control means for controlling input and output operations of said ferroelectric capacitor in each said row of said plurality of said storage means by addressing said word line and said drive line, said control means being connected to said word line and said drive line in each said row;

a bit line, provided in each column of said columns of said plurality of said storage means, for transmitting said data into and from said ferroelectric capacitor in each said column through said transmission means, said bit line being connected to a source of said transmission means in each said column; and sense means for reading data from or writing data into said storage means through said bit line;

wherein said control means outputs a high level pulse to control said transmission means in each said row through said word line so that said storage means connected to said transmission means are commonly controlled, said sense means carries out a sense operation while said word line is at a high level and said drive line is at a low level, said sense means rereads data from or rewrites data into said storage means while said word line is at said high level and said drive line is at a high level.

2. A memory circuit according to claim 1, wherein each said transmission means is composed of a MOS field effect transistor.

3. A memory circuit according to claim 1, wherein each said ferroelectric capacitor of said storage means is formed with lead zircon-titanate.

* * * * *